United States Patent [19]
Marantette et al.

[11] Patent Number: 5,302,166
[45] Date of Patent: Apr. 12, 1994

[54] TOOL CHANGER

[75] Inventors: William F. Marantette; Joseph E. Smith, both of Torrance, Calif.

[73] Assignee: Optima Industries, Inc., Torrance, Calif.

[21] Appl. No.: 839,131

[22] Filed: Feb. 21, 1992

[51] Int. Cl.$^5$ ............................................. B23Q 3/157
[52] U.S. Cl. ........................................... 483/1; 483/53; 483/64; 483/67; 483/702; 414/737; 294/64.1
[58] Field of Search ............... 483/1, 51, 53, 61, 64, 483/66, 67, 902, 13; 414/737; 408/3, 14, 16, 226; 294/64.1; 901/41, 40

[56] References Cited

U.S. PATENT DOCUMENTS

| | | | |
|---|---|---|---|
| 4,590,662 | 5/1986 | Norota | 483/64 |
| 4,658,494 | 4/1987 | Ohtani et al. | 483/51 X |
| 5,111,573 | 5/1992 | Ito et al. | 483/1 |

Primary Examiner—Z. R. Bilinsky
Attorney, Agent, or Firm—Poms, Smith, Lande & Rose

[57] ABSTRACT

A tool changer is provided in which a rotary tray positioned beneath the forward edge of a machine tool supports a large number of tools in individual cartridges. A tool changer head includes two outwardly projecting tubular members and can be rotated about a horizontal axis, moved vertically and pivoted about a vertical axis. A vacuum or positive pressure can be generated in the tubular members. Therefore, the tubular members can be positioned over a tool in one of the cartridges after which the tool changer head is raised and rotated to extend the tool into the spindle of a machine tool which has been run past the forward edge of the machine. Negative pressure will withdraw the tool from the cartridge and positive pressure will drive the tool into the spindle. Similarly, a tool can be removed from the spindle by negative pressure and reinserted into the cartridge by positive pressure.

19 Claims, 8 Drawing Sheets

TOOL CHANGER

BACKGROUND OF THE INVENTION

Conventional tool changers are limited both in their capacity and speed of operation. This restricts their applicability and increases the cost of operation of the machine tool with which the tool changer is associated. The performance of conventional tool changers is far from adequate for a certain high speed drilling and routing machine used in the manufacture of printed circuit boards. This machine has a positioning mechanism of the type disclosed in patent application Ser. No. 740,151, filed Aug. 5, 1991, for ARRANGEMENT FOR PROVIDING PLANAR MOVEMENT OF A MACHINE TOOL, and a spindle as set forth in patent application Ser. No. 660,149, filed Feb. 22, 1991, for ARRANGEMENT FOR DRIVING A ROTARY TOOL. These applications are assigned to the assignee of the present application. Such a machine is operated so rapidly that a tool becomes worn out in a very short period of time from having drilled a very large number of holes. Frequent replacement of drills is required as the drills wear out. Also, drills of different sizes must be provided for the machine to form the variety of holes required in the production of printed circuit boards. With a conventional tool changer so much time will elapse in removing and inserting drills that production is slowed down and expense therefore becomes greater. Also, the conventional tool changer can accommodate only a relatively small number of tools. An operator must be continually restocking the tool changer which is a laborious and time consuming operation. This also increases the chance for error in providing some tool of the wrong size in the tool changer magazine.

Conventional tool changers also tend to be overly complex and expensive to construct and maintain.

SUMMARY OF THE INVENTION

The present invention provides an improved tool changer of very rapid action and large capacity. Nevertheless, it is of relatively simple and economical construction while being thoroughly reliable in its operation.

The tool changer of this invention is mounted adjacent and beneath the forward edge of the worktable of a machine tool, such as an automatic drilling machine. Beneath the table is a circular rotary tray driven by a suitable means so that it can achieve any desired rotational position. The tray includes means defining recesses which receive tool cartridges arranged in a radial pattern and in a horizontal plane. In a typical design, 270 cartridges each with 10 tools can be accommodated.

The cartridges are of conventional design being an elongated plastic member with a row of openings into which the shanks of the tools are inserted with the cutting ends projecting outwardly.

The tool changer also includes a movable head from which projects two tubular members. The head can be rotated about a horizontal axis and it can be moved vertically by a lead screw. It also may be rotated about a vertical axis. As a result of this, the tool changer head may be moved so as to position either one of the tubular members over a selected one of the cartridges and at a particular opening in the cartridge. The head also may move to position either tubular member at the bottom of the spindle of the machine when the spindle has been extended beyond the forward edge of the worktable.

In operation, the tool changer head will be rotated so as to extend one of the tubular members down over a selected tool in one of the cartridges. The tray will have been rotated to position the desired cartridge where the tool changer head can accomplish this. A vacuum then is created in that tubular member causing it to withdraw the tool from the cartridge into the tubular member where it engages a stop. The head then is raised and rotated so that the other of the tubular members can be inserted into the base of the spindle of the machine after the spindle has been extended beyond the forward edge of the worktable. The machine tool will release the tool that is within the spindle and it will be drawn into the tubular member as a vacuum is created in the latter element. The tool head then descends slightly and is rotated to position the tubular member containing the fresh tool beneath the spindle. Then the tool changer head is raised so that the latter tubular member is inserted into the base of the spindle. A positive pressure then is created in that tubular member, driving the tool into the spindle where it is gripped. This operation takes only a few moments. After this the tool changer head is lowered and rotated again so that the used tool is positioned at the opening in the cartridge from which the new tool was taken. This tool is dropped and also forced into the cartridge by positive pressure within the tubular member.

The cycle then can be repeated to obtain the various cartridges from the rotatable tray. As the spindle is in operation, the tool changer can be positioned so that it is immediately below the forward edge of the worktable, holding a new tool in one of the tubular members. It will then be ready to instantly withdraw the next used tool from the spindle and insert the new tool in its place.

DETAILED DESCRIPTION OF THE INVENTION

Figure 1:
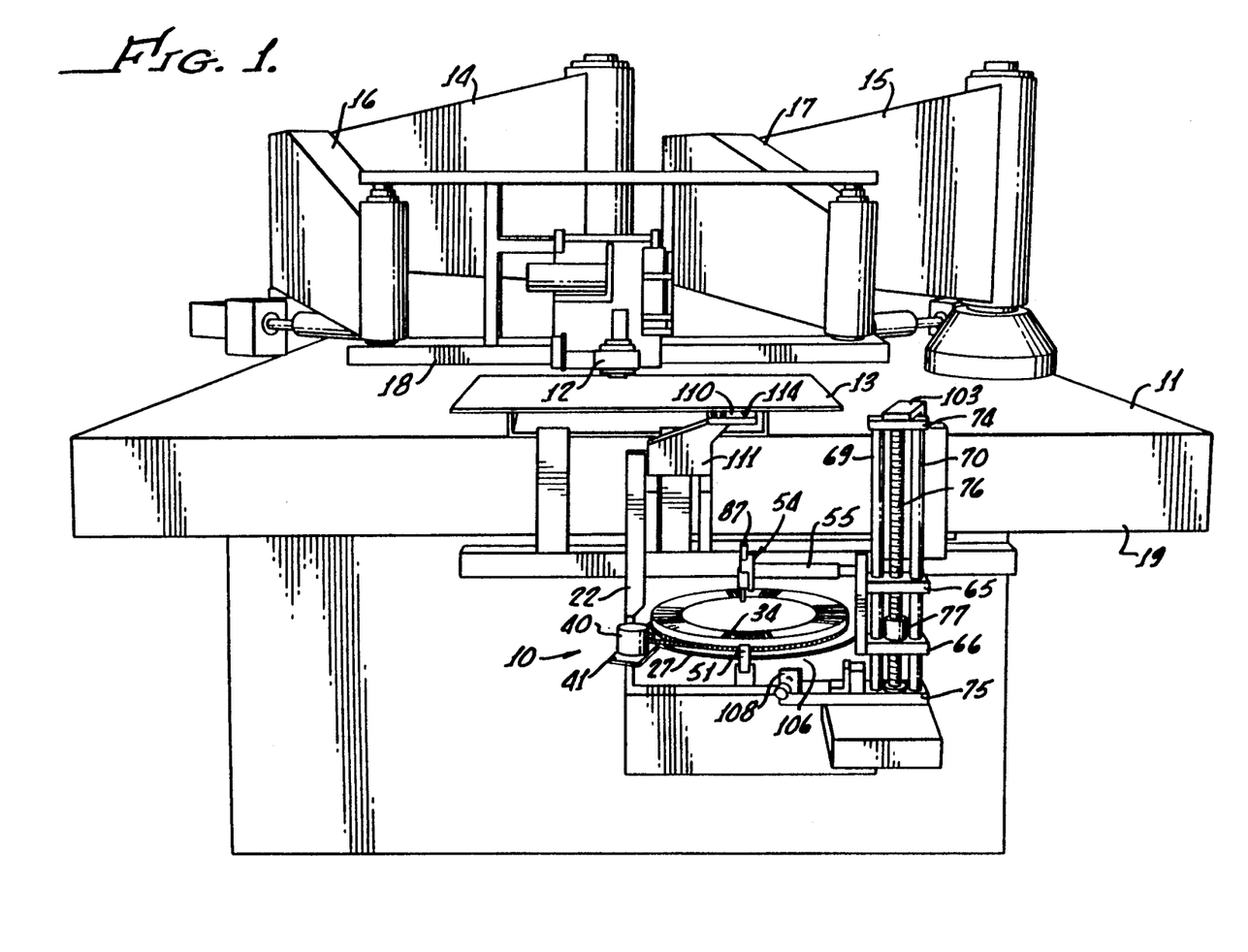
FIG. 1 is a perspective of the tool changer of this invention as associated with a drilling and routing machine.

The tool changer 10 of this invention is illustrated in FIG. 1 in association with a drilling and routing machine which includes a granite table 11 and a linkage for moving a spindle 12 in a horizontal plane above the table 11 and the tooling plate 13 supported by the table. The linkage may be of the type illustrated in the aforementioned patent application Ser. No. 740,151 and the spindle may be of the type disclosed in patent application Ser. No. 660,149. The linkage includes pivotal arms 14, 15, 16 and 17 which move a forward link 18 upon which is mounted the spindle 12. With this arrangement it is possible to move the spindle 12 outwardly beyond the forward edge 19 of the table 11.

The tool changer includes a frame having vertical members 22 and 23 that attach to the forward edge 19 of the table 11 by fasteners 24. The horizontal bottom portion 25 of the frame carries a vertical shaft 26 which rotatably mounts a circular tray 27. This positions the tray in a horizontal plane beneath the table 11, with a portion of the tray beyond the forward edge 19 of the table.

Figure 4:
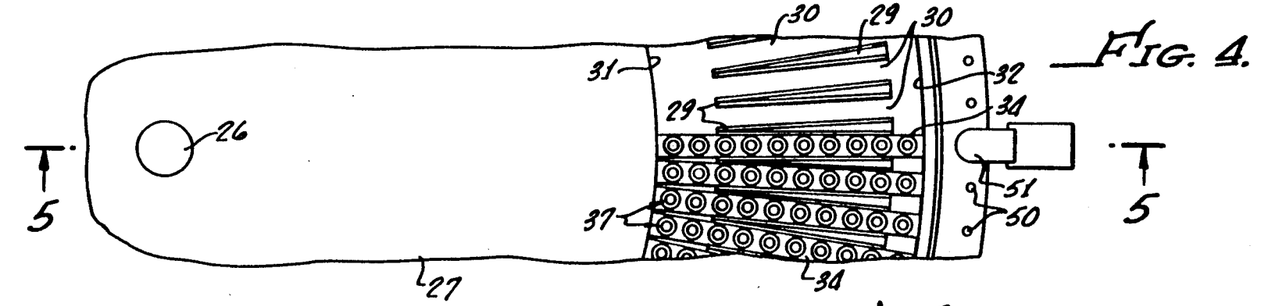
FIG. 4 is an enlarged fragmentary plan view of a portion of the tool holding tray and the cartridges supported by it.
Figures 5, 6, 7:
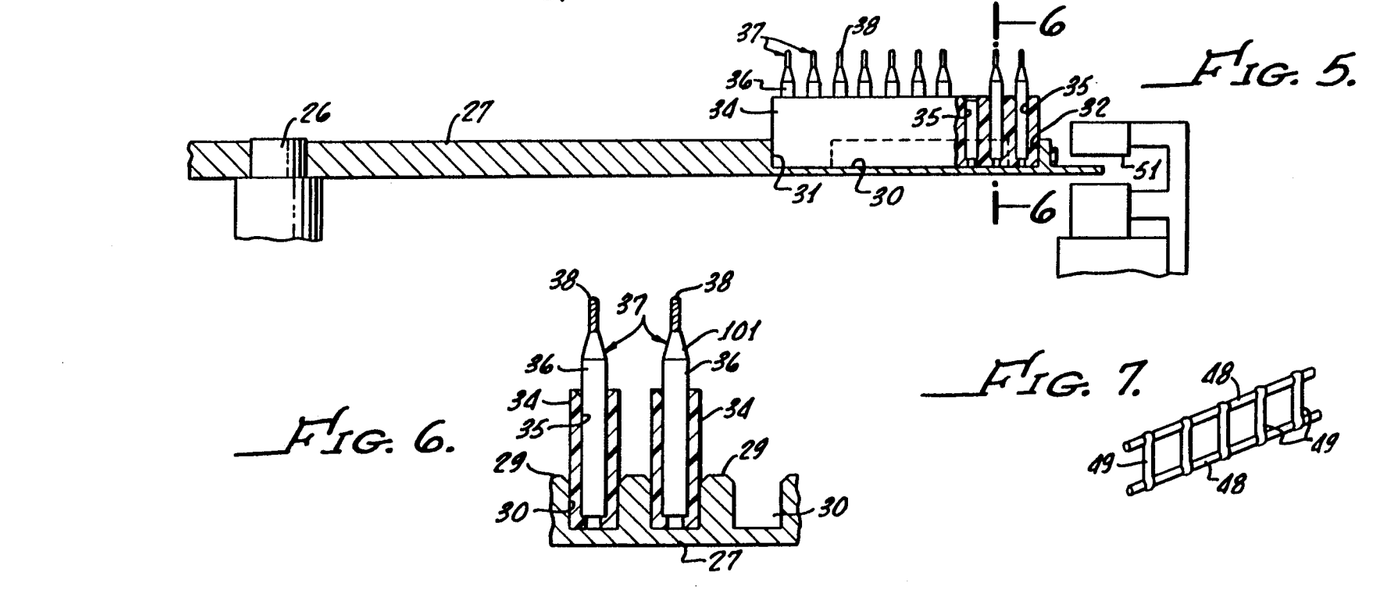
FIG. 5 is a sectional view taken along line 5-5 of FIG. 4.
FIG. 6 is an enlarged fragmentary sectional view showing the arrangement of the cartridges in the tray.
FIG. 7 is a fragmentary perspective view of the type of belt used in driving the components of the invention.

Formed in the upper surface of the tray 27 in an annular pattern are guides 29 which define radial slots 30 which have parallel side walls. The upper surface of the tray is recessed at the slots 30 to define inner and outer shoulders 31 and 32, respectively (FIGS. 4 and 5). Each slot 30 is adapted to receive a conventional cartridge 34, which is an elongated member with a series of openings 35 in it, the axes of which are parallel and all in the same plane. The shanks 36 of tools, such as the drills 37 illustrated, or routers, fit within the openings 35. This locates the cutting ends 38 of the drills 37 exposed outside the cartridge 34. Typically a cartridge will accommodate ten tools 37. The tray 27 may have 270 slots, 30 formed in its upper surface so that it will accommodate 2700 drills 37. When the cartridges 34 are in the slots 30 the axes of the tools 37 are all vertical and the tools are positioned radially with respect to the tray.

Rotation of the tray 27 about the shaft 26 is accomplished by a motor 40 mounted on a bracket 41. The motor has a vertical shaft which drives a sprocket 42 positioned beneath the bracket. A belt 43 extends from the sprocket 42 to a larger sprocket 44 which, in turn, drives a smaller sprocket 45. A belt 46 is driven by the sprocket 45 and extends around the periphery of the tray 27. A spring-loaded idler sprocket 47 maintains tension on the belt 46 which frictionally drives the tray 27.

The belts used in the tool changer may be the commercially available type that includes two plastic covered parallel steel bands 48 interconnected by spaced transverse members 49, as seen in FIG. 7. This enables the belts to be driven positively by sprockets.

Extending vertically through the periphery of the tray 27, radially outwardly of the slots 30, are openings 50. One opening 50 is beyond each of the slots 30. A photoelectric cell 51 is mounted on a fixed bracket 52 so that its light beam is aligned with the circle on which fall the openings 50. This provides a means for generating a signal used in rotationally positioning the tray 27.

Figure 8:
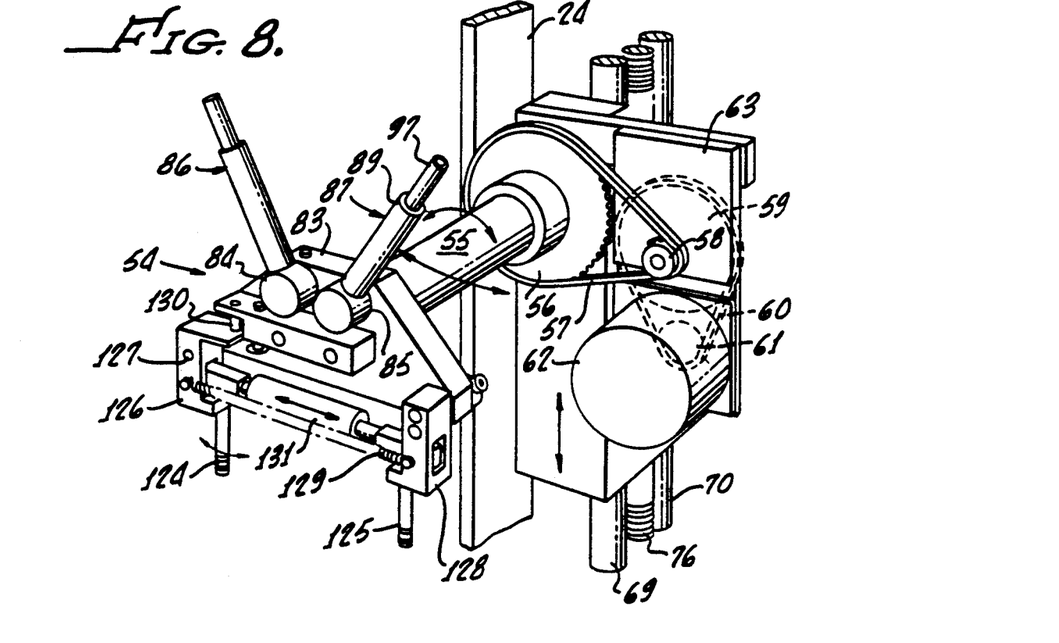
FIG. 8 is a fragmentary perspective view of the head portion of the tool changer.
Figure 9:
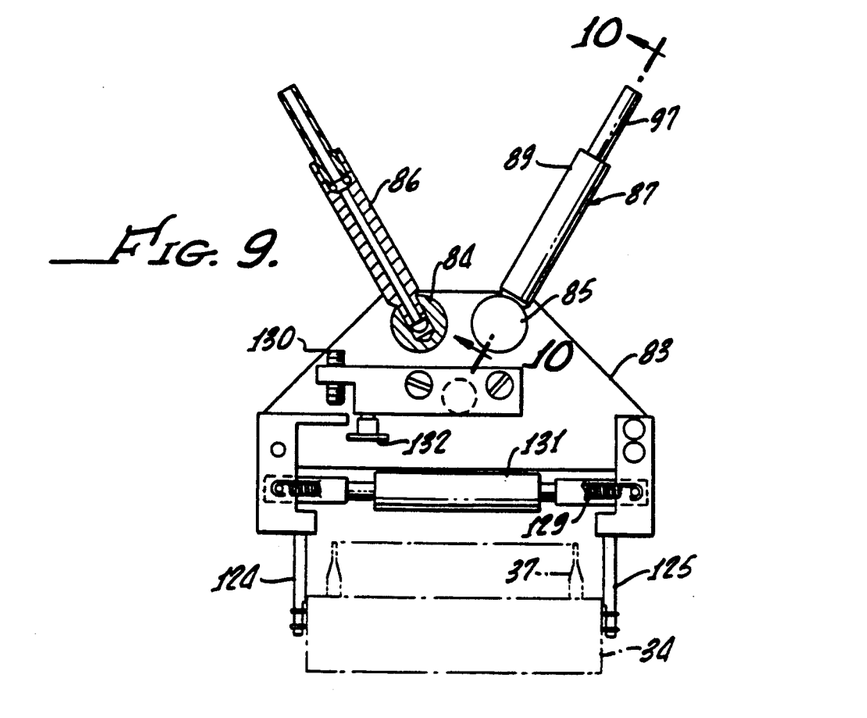
FIG. 9 is an end elevational view of the head portion of the tool changer.

Tools can be exchanged between the cartridges 34 and the spindle 12 by means of a rotary head 54 which is driven by a shaft 55 (FIGS. 8 and 9). The latter element is turned by a sprocket 56 driven by a belt 57 which, in turn, is rotated by a sprocket 58. A larger sprocket 59 rotates with the sprocket 58 and, through a belt 60, is driven by a smaller sprocket 61 rotated by a motor 62. The shaft 55, sprockets 56, 59 and 61 and the motor 62 are mounted on a vertical support 63, carried by two spaced parallel horizontal bars 65 and 66. Two openings are provided in the bar 65 and provided with bearings 67 and 68 that slidably receive vertical guide rods 69 and 70. There are similar bearings 71 and 72 in the bar 66 that also receive the rods 69 and 70. This means that the vertical support 64, and hence the head 54, is movable vertically in a path defined by the rods 69 and 70.

Figure 2:
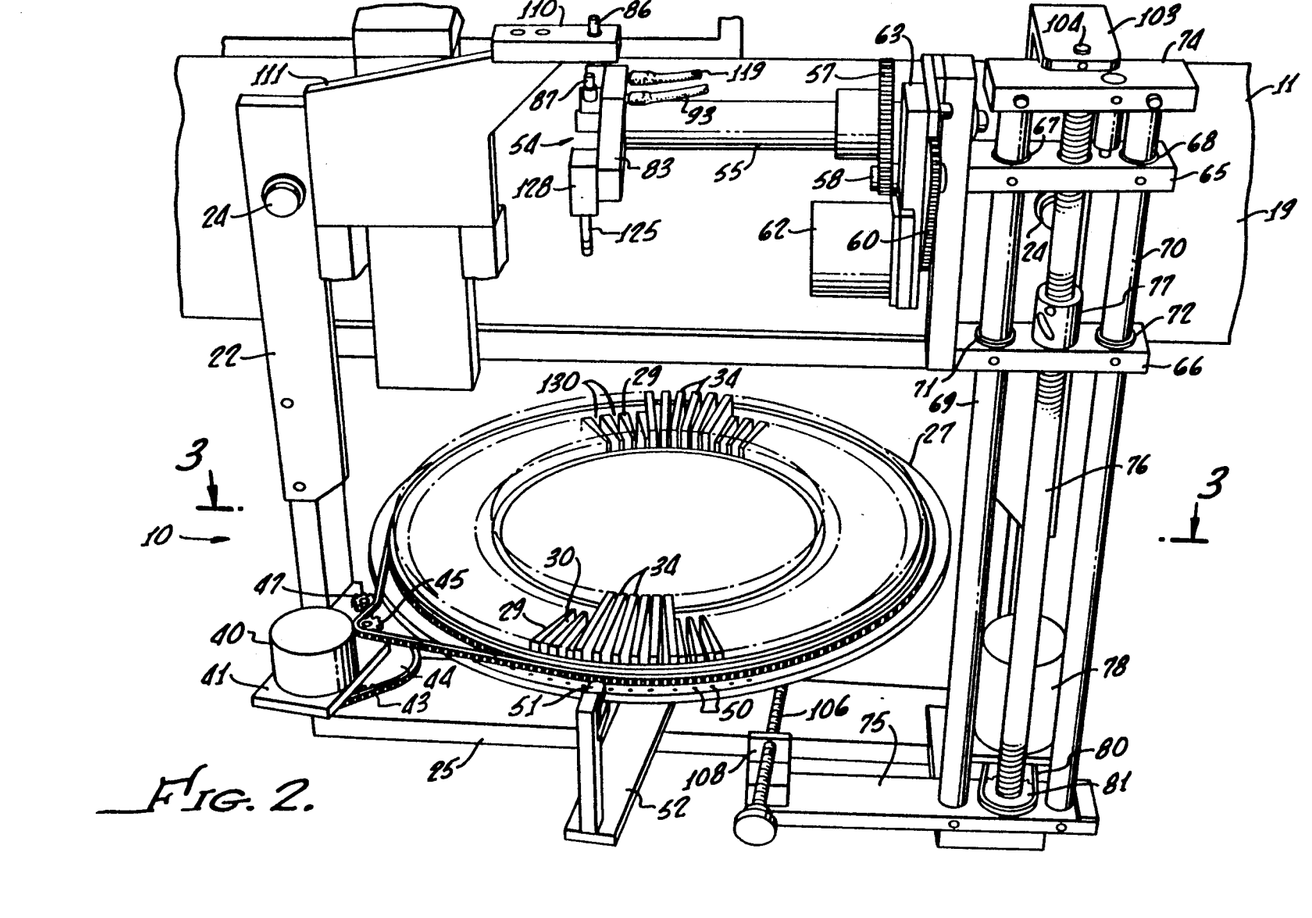
FIG. 2 is an enlarged perspective view of the tool changer.
Figure 3:
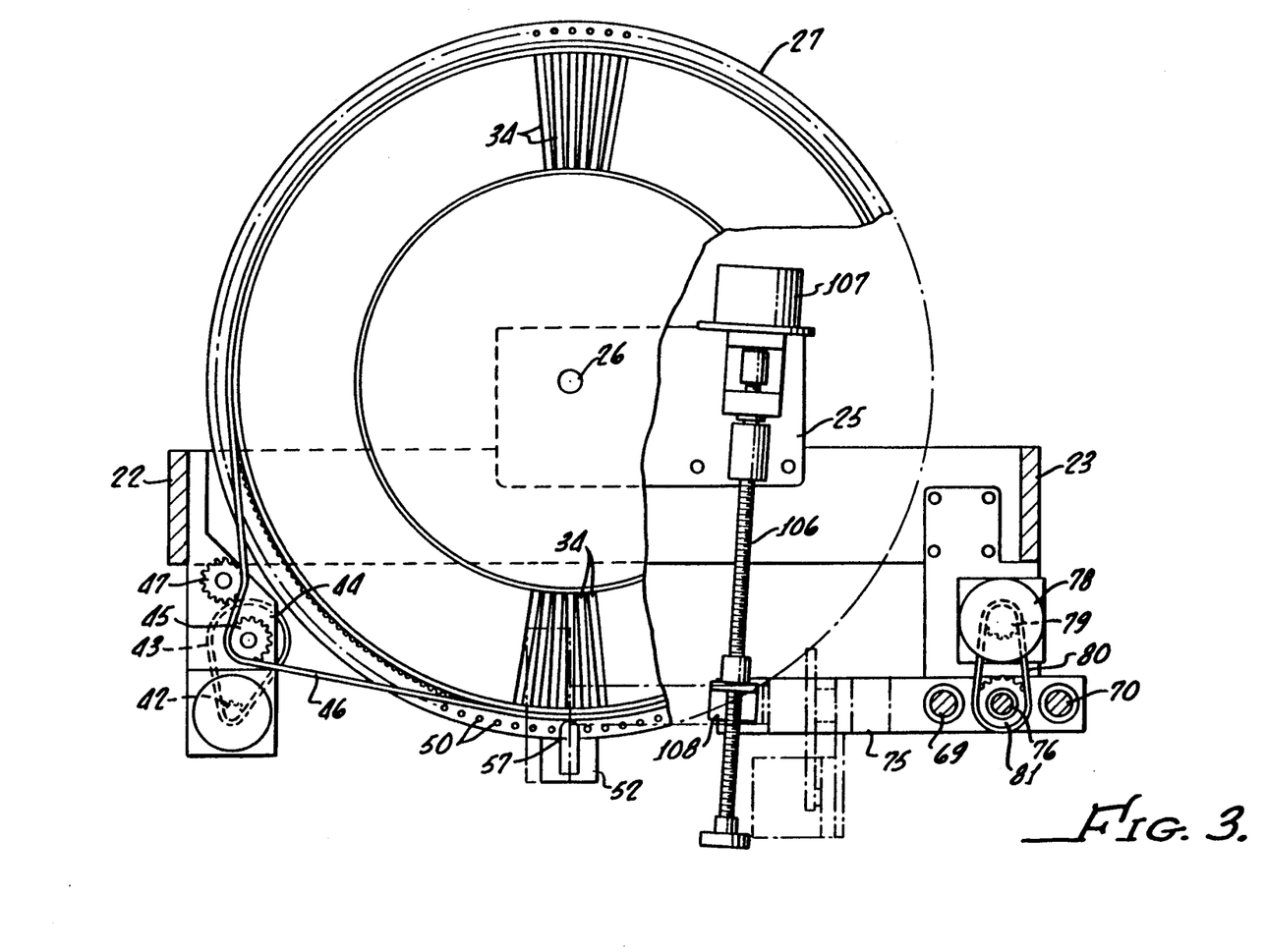
FIG. 3 is a sectional view taken along line 3—3 of FIG. 2 and partially broken away.

The vertical rods 69 and 70 are held at their ends by upper and lower horizontal brackets 74 and 75, respectively, as seen in FIG. 2. Also, extending between the brackets 74 and 75 parallel to the rods 69 and 70 is a lead screw 76. A nut 77 is mounted on the lower horizontal bar 66 and meshes with the lead screw 77. A clearance opening is provided through the upper bar 65 for the lead screw 76. Rotation of the lead screw 76 is accomplished by a motor 78 which rotates a sprocket 79 which, through a belt 80, drives a sprocket 81 attached to the lead screw. Therefore, rotation of the lead screw 76 can vary the vertical position of the tool changer head 54 causing it to move in a path perpendicular to the tray 27.

Figure 10:
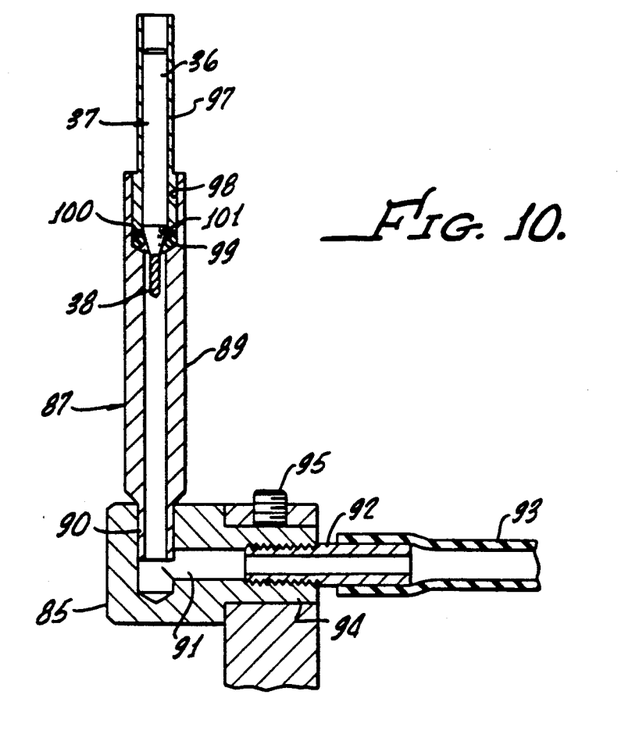
FIG. 10 is an enlarged sectional view illustrating one of the tube assemblies which is used in the removal and insertion of the tool.
Figures 11, 16:
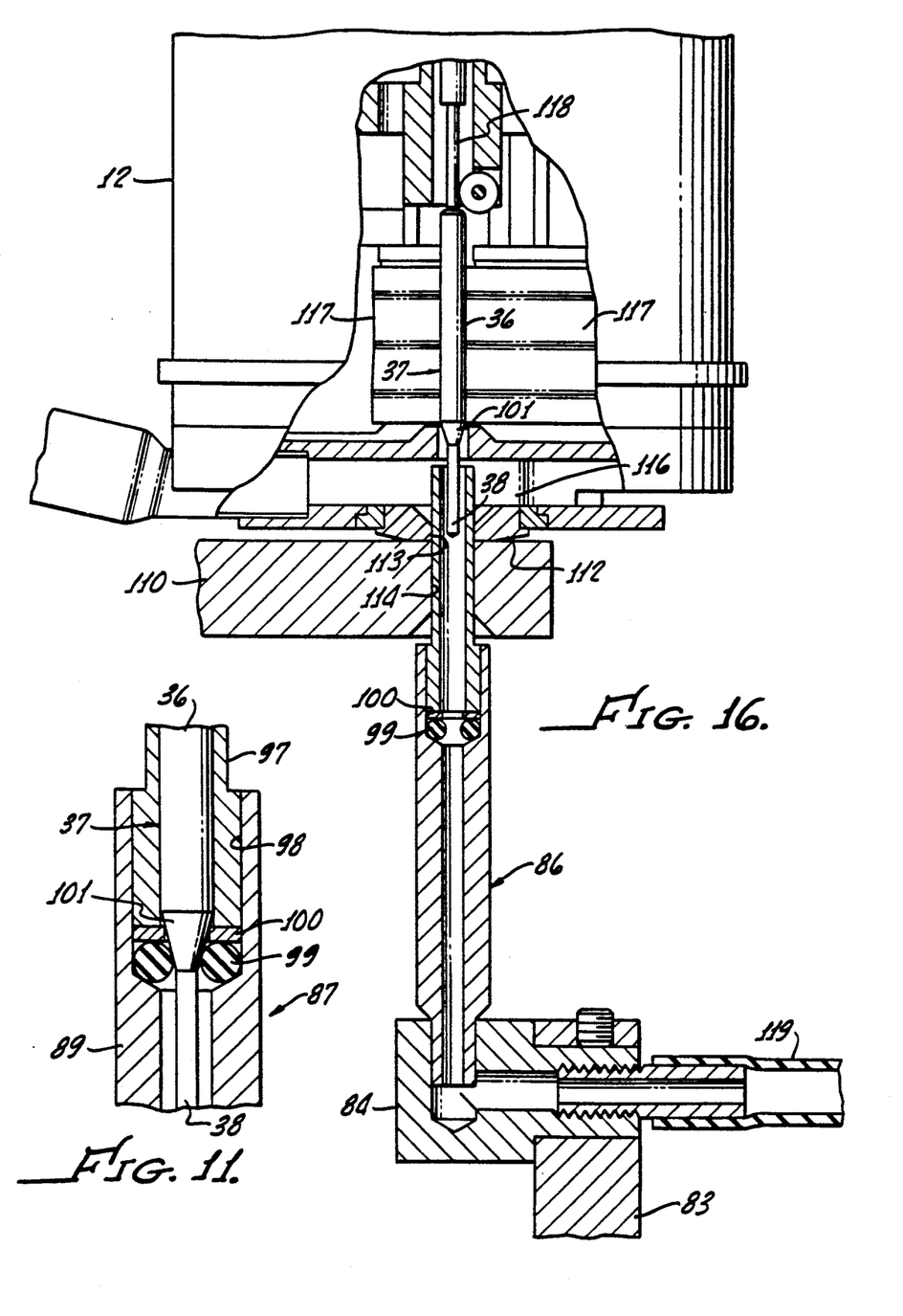
FIG. 11 is an enlarged fragmentary sectional view of a portion of the tool assembly.
FIG. 16 is an enlarged sectional view showing the tool changer as it is associated with the spindle of the machine tool.

The tool changer head 54 includes a vertical plate 83 which carries fitting members 84 and 85 from which project tube assemblies 86 and 87. The arrangement of the tube assembly 87 is shown in FIGS. 10 and 11, the other tube assembly 86 being identical. The tube assembly 87 includes a first tube 89 of relatively thick wall which has an inner end portion 90 of reduced diameter that extends into the fitting member 85. There it communicates with one end of a passageway 91 in the fitting member. A sleeve 92 threads into the opposite end of the passageway 91 and connects to an air hose 93. The fitting member 85 has an end portion 94 of reduced dimension which fits within an opening in the plate 83, where it is held by a set screw 95.

A second tube 97 extends from the outer end of the tube 89 and is provided with a relatively thick-walled inner end portion that fits within a counterbore 98 in the end of the tube 89. An O-ring 99 is received at the inner end of the counterbore 98 and a metal washer 100 is positioned between the O-ring and the end of the tube 97. The tube 97 is dimensioned so that it can receive a drill bit 37 with the cutting end 38 extending into the tube 89. The tapered portion 101 of the drill bit 37, between the shank 36 and the cutting end 38, then engages the washer 100 which acts as a stop cushioned by the O-ring 99.

The top and bottom brackets 74 and 75 are rotatable to permit positioning of the head 54 radially relative to the tray 27. The vertical support member 23 that is attached to the worktable 11 terminates in a horizontal upper end portion 103 which, through a pin 104, rotatably mounts the bracket 74 at the axis of the lead screw 75 (FIG. 2). A similar mounting is provided for the bottom bracket 75 at its connection to the bottom frame portion 25. Rotation of the head is accomplished by means of a lead screw 106 driven by a motor 107. The lead screw 106 meshes with a nut 108 which is supported by the bottom bracket 75, but free to pivot with respect to it.

Figure 12:
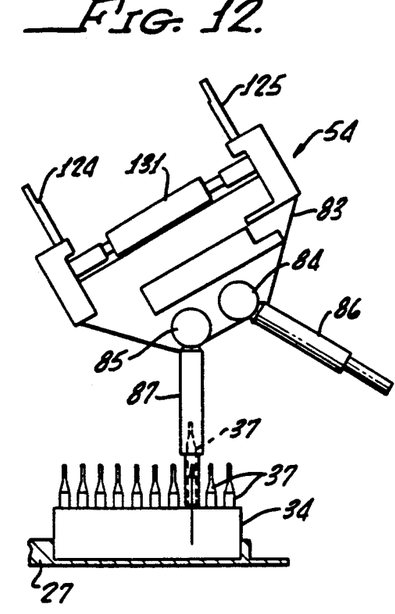
FIGS. 12, 13, 14 and 15 are views illustrating various positions of the tool changer head during the removal and insertion of tools.

In operation of the device, the head 54 is rotated about a vertical axis, i.e., an axis perpendicular to the tray 27, to give it a predetermined position radially of the tray 27 and hence with respect to the drill bits 37. This is accomplished, of course, by appropriate rotation of the lead screw 106. The shaft 55 also is turned to rotate the head 54 about an axis parallel to the tray 27 to give the head the position shown in FIG. 12. The head is lowered by rotation of the lead screw 75 to bring the tube assembly 87 down over a selected one of the drills 37. Inasmuch as the head 54 pivots about the axis of the lead screw 76, rather than moving radially with respect to the tray 27, the tray is positioned rotationally so that the tube assembly 87 will be aligned with the selected drill.

A vacuum then is created in the passageway 91 of the fitting member 84 and hence within the tube assembly 87. This results from connection of the hose 93 with a source of vacuum. The vacuum draws the selected drill 37 into the tube assembly 87 where it is stopped by the washer 100 and held in position by the negative pressure. The head 54 then is lifted, and is moved to the vicinity of the forward edge 19 of the table 11 beneath a rectangular horizontal bar 110 which is held by a support 111 adjacent the tooling plate 13. The spindle 12 is moved by the links 14, 15, 16 and 17 to a position over the bar 110 and is moved downwardly so that its pressure foot 112 bears against the upper surface of the bar 110. The spindle 12 is located so that the bottom opening 113 of the pressure foot 112 is aligned with a vertical opening 114 through the bar 110.

Figure 13:
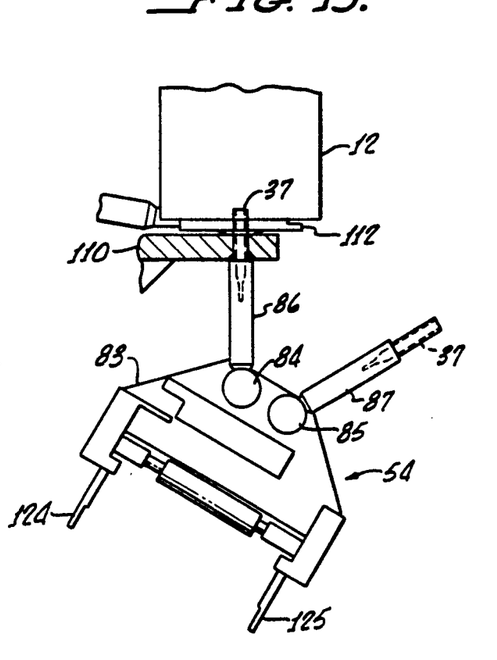

The head 54 is rotated appropriately and raised to extend the outer portion of the empty tube assembly 86 through the openings 113 and 114 into the chamber 116 of the pressure foot 112, as seen in FIGS. 13 and 16. Within the spindle 12 is a drill 37 which is to be removed and replaced. The worn drill 37 normally is held in the spindle 12 by three rollers 117 (two of which are seen in FIG. 16) which surround the drill and frictionally drive the drill by engaging its shank 36. Tilting of the roller axes causes axial movement of the drill. A spring-biased rod 118 engages the upper end of the shank 36 in all positions of the drill, this being a component of a position pickoff which creates a signal indicating the axial location of the drill relative to the other components of the spindle. When a drill 37 is to be removed from the spindle it is moved downwardly by the rollers 117 and in the position of FIG. 16 is partially received in the tube assembly 86.

Figure 14:
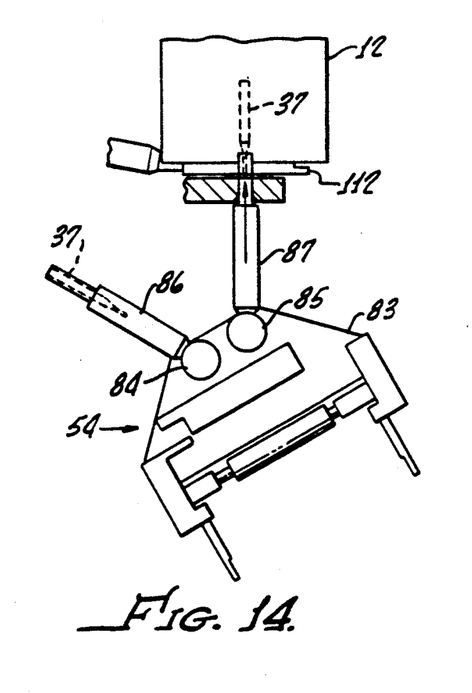

The rollers 117 then are separated slightly to release the drill 37. In addition, a vacuum is created in the tube assembly 86 by means of a connection to the hose 119 that connects to the fitting 84. The worn drill 37 is drawn into the tube assembly 86 both by gravity and the vacuum, and stopped against the washer 100 within it. The negative pressure in the tube assembly 86 holds the worn drill 37 in this position. The head 54 then is lowered a short distance and rotated to a position where the tube assembly 87 is beneath and aligned with the spindle 12. After this, the head 54 is raised so that the tube assembly 87 assumes the position of FIG. 14, where it extends into the pressure foot 112, just as did the tube assembly 86 previously. Pressurized air then is introduced into the tube assembly 87 through the line 93, forcing the drill 37 from the tube assembly 87 into the spindle 12. As the drill 37 enters the spindle, the end of the shank 36 engages the rod 118 which stops the drill at a known axial position relative to the spindle. The rollers 117 then are moved inwardly to engage the shank 36 of the newly-inserted drill so that the spindle 12 is ready to resume operation and may be moved back over the tooling plate 13 for this purpose.

Figure 15:
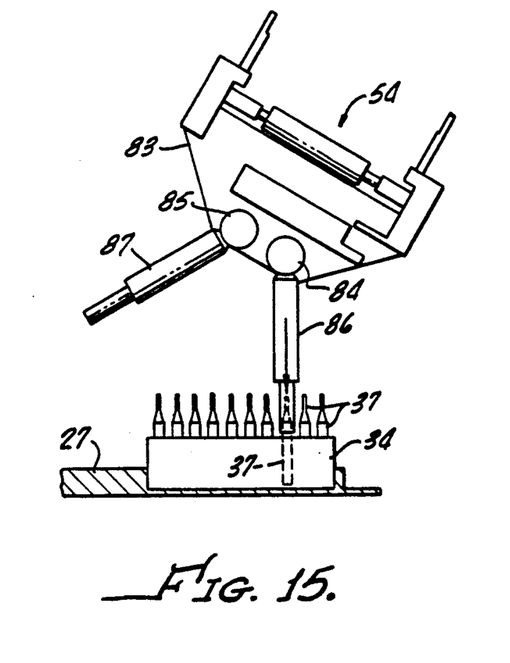

In the meantime, the head 54 is rotated and lowered to the position of FIG. 15. This positions the tube assembly 86 immediately above the opening 35 in the cartridge 34 which was vacated as the drill was removed for insertion into the spindle. When so aligned, the vacuum is released in the tube assembly 86 and a positive pressure substituted, driving the used drill 37 into the opening 35. The head 54 then is raised.

The head 54 then may be positioned over another drill 37 to draw it into the tube 87 for insertion into the spindle 12 in the next tool change to be effected as the cycle is repeated. The tube assembly 87 may be positioned over a drill 37 in the same cartridge 34 from which the last drill was removed or by appropriate rotation of the tray 27 the next drill may be removed from any one of the cartridges arranged around the periphery of the tray.

Figure 17:
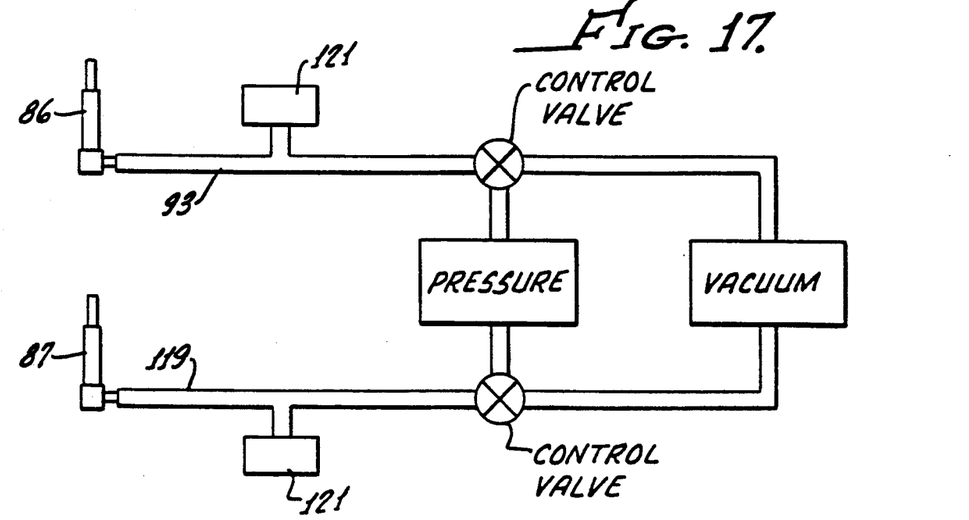
FIG. 17 is a schematic illustration of an arrangement for supplying pressure or vacuum to the tool changer receptacles.

An arrangement for supplying the positive and negative pressure to the tube assemblies 86 and 87 is illustrated schematically in FIG. 17.

A signal is created to indicate whether or not the tube assembly 86 or 87 has received a drill as intended from a cartridge 34 or the spindle 12. This is accomplished by pressure switches 121 in the air lines 93 and 119, as indicated in FIG. 17. If a drill is present, the air flow path through the tube assembly is largely blocked so that the negative pressure will increase. This provides an indication that a drill is present. The absence of such a higher vacuum shows that the tool has not been picked up.

The head 54 also may be used to move cartridges 34 relative to the tray 27. This is accomplished by means of short pins 124 and 125 which are spaced apart in a parallel relationship. The pin 124 is carried by a pivotal link 126, as seen in FIGS. 8 and 9, which can rotate about a pin 127 that connects to the support plate 83 of the head. The bracket 128 that supports the pin 125 is fixed. A tension spring 129 extends between the link 126 and the bracket 128, urging the link 126 to rotate about the pin 127 to position pins 124 and 125 closer to each other. A stop screw 130 limits the amount of such movement of the link 126.

An air cylinder 131 extends between the links 126 and the bracket 128 on the same side of the pin 127 as the spring 129. Extension of the air cylinder 131 will overcome the force of the spring 129, rotating the link 126 so as to separate the pins 124 and 125. This movement is limited by a stop 132.

When it is desired to move a cartridge 34, the air cylinder 131 is activated so as to separate the pins 124 and 125. The head 54 then is lowered over a cartridge 34 with the pins 124 and 125 aligned with the ends of the cartridge. The pressure in the air cylinder 131 then is released allowing the spring 129 to rotate the link 126 so as to move the pin 124 toward the pin 125. The pins 124 and 125 then engage the ends of the cartridge 34, gripping it by the force exerted by the spring 129. The head 54 then may be raised and moved as desired to accomplish a necessary repositioning of the cartridge 34. This may be done in removing cartridges 34 from the tray 27 and bringing new cartridges onto the tray from a supply bin.

The foregoing detailed description is to be clearly understood as given by way of illustration and example only, the spirit and scope of this invention being limited solely by the appended claims.

What is claimed is:

1. A tool changer comprising
    tool holder means for supporting a tool, receptacle means adapted to receive a tool, movable means for relatively moving said tool holder means and receptacle means to position where said receptacle means is adjacent said tool holder means,
    means for creating a vacuum in said receptacle means for drawing a tool from said tool holder means into said receptacle means, said moveable means further including means for moving said receptacle means to a position adjacent a machine for operating said tool, and
    means for creating a positive pressure in said receptacle means for forcing said tool into said machine for operation thereby.

2. A device as recited in claim 1 in which said tool holder means includes a tray and a plurality of cartridges on said tray, said cartridges having openings therein for receiving the shanks of tools, and said movable means includes means for rotating said tray.

3. A device as recited in claim 2 in which said tray is circular and includes means for supporting said cartridges radially on said tray, said cartridges holding said tools in linear alignment.

4. A device as recited in claim 1 in which said movable means includes means for moving said receptacle means linearly in a direction perpendicular to said tray, rotationally about an axis perpendicular to said tray, and rotationally about an axis parallel to said tray.

5. A device as recited in claim 1 in which said tool holder means includes means for supporting a plurality of tools, and said movable means can position said receptacle means adjacent each of said plurality of tools in said tool holder means.

6. A device as recited in claim 1 including a second receptacle means, said movable means including means for relatively moving said second receptacle means and said tool holder means to a position where said second receptacle means is adjacent said tool holder means, and for moving said second receptacle means to a position adjacent said machine, means for creating a vacuum in said second receptacle means for withdrawing a tool from said machine, and means for creating a positive pressure in said second receptacle means for depositing a tool in said tool holder means.

7. In combination with a machine tool having a spindle capable of rotating cutting tools each of which has a shank,
    a tool changer comprising
        a plurality of tool-holding cartridges each of which has a plurality of openings adapted to receive the shank of a tool with portions of said tool projecting outwardly therefrom,
        support means for said cartridges,
            said support means for said cartridges being movable relative to said machine tool,
        a duality of tubular members each of which is dimensioned to receive one of said tools, support means for said tubular members,
            said support means for said tubular members being movable relative to said machine tool and to said support means for said cartridges,
        means for creating a vacuum in each of said tubular members, and
        means for creating a positive pressure in each of said tubular members,
            whereby when one of said tubular members is positioned adjacent one of said cartridges it can withdraw a tool therefrom when a vacuum is created in said one tubular member, and said one tubular member can deliver said tool to said spindle when said one tubular member is positioned adjacent said spindle and a positive pressure is created therein for forcing said tool out of said one tubular member and into said spindle, and the other of said tubular members can withdraw a tool from said spindle when said other tubular member is adjacent said spindle and a vacuum is created therein, and can deliver a tool so received from said spindle to one of said cartridges when moved to a position of adjacency with one of said cartridges and a positive pressure is created in said other tubular member.

8. A device as recited in claim 7 in which each of said tubular members includes an internal stop for limiting the entry of said tools therein.

9. A device as recited in claim 8 in which said stop includes a washer and a resilient O-ring engaged by said washer.

10. A device as recited in claim 7 in which said support means for said cartridges includes a rotatable tray.

11. A device as recited in claim 10 in which said support means for said cartridges includes receptacles in said tray for said cartridges, said receptacles being radial with respect to said tray so that said cartridges are arranged radially with respect to said tray.

12. A device as recited in claim 7 in which said support means for said cartridges positions said cartridges in a predetermined plane, and said support means for said tubular members comprises a support member, said tubular members projecting outwardly from said support member, said support member being rotatable about an axis parallel to said predetermined plane and about an axis parallel to said predetermined plane, said support member being movable linearly in a direction perpendicular to said plane.

13. The method of providing a tool for a machine tool which includes a spindle for driving said tool comprising the steps of
    positioning a tool holder adjacent said machine tool,
    supporting a tool on said tool holder, positioning a receptacle adjacent said tool, creating a negative pressure in said receptacle for causing said tool to be withdrawn from said tool holder and to enter said receptacle,
    positioning said receptacle adjacent said spindle, and
    creating a positive pressure in said receptacle so as to force said tool out of said receptacle and into said spindle.

14. The method as recited in claim 13 including the steps of positioning a receptacle adjacent said spindle at a time when a tool to be changed is in said spindle, releasing said tool from said spindle, creating a negative pressure in said last-mentioned receptacle, positioning said last-mentioned receptacle adjacent a tool holder, and creating a positive pressure in said last mentioned receptacle so as to force said tool out of said last-mentioned receptacle and onto said tool holder for being supported by said tool holder.

15. The method as recited in claim 14 in which said tool holder is provided with a plurality of opening means for supporting a plurality of tools, said first-mentioned receptacle being so positioned adjacent a tool in one of said opening means, said last-mentioned receptacle means being so positioned adjacent said tool holder at said one opening means for causing a tool removed from said spindle to be supported by said tool holder at the same opening means from which a tool was withdrawn for being forced into said spindle.

16. The method as recited in claim 14 in which two of said receptacles are provided, the receptacle positioned adjacent said tool holder for withdrawing a tool therefrom being different from the receptacle positioned adjacent said tool holder for forcing a tool onto said tool holder.

17. The method as recited in claim 13 in which for said tool holder a rotatable tray is provided, and a plurality of cartridges are provided on said tray, each of said cartridges supporting a plurality of tools, and said tray is rotated to bring selected cartridges adjacent said receptacle for removal of a tool therefrom.

18. The method as recited in claim 17 in which said receptacle is rotated about an axis parallel to said tray, rotated about an axis perpendicular to said tray and moved linearly along a path perpendicular to said tray for removal of a selected tool from a selected cartridge on said tray.

19. The method as recited in claim 17 in which said tools are provided with a cutting end and a shank end, said tools being positioned in said cartridges so that said cutting ends extend therefrom.

* * * * *